(12) United States Patent
Zhu et al.

(10) Patent No.: US 12,733,120 B2
(45) Date of Patent: Sep. 8, 2026

(54) REPEATEDLY, QUICKLY AND REMOVABLY CONNECTABLE RETAINING MECHANISM

(71) Applicant: FOSITEK CORPORATION, New Taipei City (TW)

(72) Inventors: Han Cheng Zhu, New Taipei City (TW); Ya Chih Huang, New Taipei City (TW)

(73) Assignee: FOSITEK CORPORATION, New Taipei City (TW)

( * ) Notice: Subject to any disclaimer, the term of this patent is extended or adjusted under 35 U.S.C. 154(b) by 206 days.

(21) Appl. No.: 18/677,056

(22) Filed: May 29, 2024

(65) Prior Publication Data

US 2025/0311135 A1 Oct. 2, 2025

(30) Foreign Application Priority Data

Mar. 29, 2024 (TW) ................................ 113112135

(51) Int. Cl.
*H05K 7/14* (2006.01)

(52) U.S. Cl.
CPC .................................. *H05K 7/1404* (2013.01)

(58) Field of Classification Search
CPC .................................................... H05K 7/1404
USPC ........................................ 361/759, 801, 803
See application file for complete search history.

(56) References Cited

U.S. PATENT DOCUMENTS 6,437,987 B1 * 8/2002 Lin ...................... H05K 7/1431 361/759
7,203,076 B1 * 4/2007 Liang ...................... G06F 1/185 361/755
2013/0109216 A1 * 5/2013 Chien ................ H01R 12/7005 439/345
2013/0250537 A1 * 9/2013 He ..................... H01R 12/7029 248/314
2019/0059167 A1 * 2/2019 Chen .................... H05K 5/0256

* cited by examiner

*Primary Examiner* — Hung S. Bui
(74) *Attorney, Agent, or Firm* — Rosenberg, Klein & Lee

(57) ABSTRACT

A retaining mechanism includes an open topped seat having a rear inner stop surface and two lateral guide sections; and a sliding clamp member received in the seat and including mating guide sections slidably engaged with the guide sections and a rear curved elastic section having a free end pressing against the inner stop surface. The sliding clamp member further includes a front pressing section having a beveled guide surface on an upper front thereof. The sliding clamp member is movable toward the inner stop surface to elastically deform the curved elastic section when an electronic card is pressed downward against the beveled guide surface, such that the sliding clamp member stores an elastic force and can automatically spring forward to retain the electronic card in place when the electronic card passes over the pressing section. The electronic card can be released simply by pushing the sliding clamp member backward.

20 Claims, 5 Drawing Sheets

40
42
4
3
41
411
241
24
31
113
11
112
111
23
25
231
151
32
15
152
2
1
13
A 40
42
4
3
241
41
24
31
113
23
25
231
2
1
A
32
151
152
13
112
111
11
15

REPEATEDLY, QUICKLY AND REMOVABLY CONNECTABLE RETAINING MECHANISM

FIELD OF THE INVENTION

The present invention relates to a retaining mechanism that can be repeatedly, quickly and removably connected to a substrate, and more particularly, to an electronic card retaining mechanism that is simple in structure, easy and convenient for use, and space-saving.

BACKGROUND OF THE INVENTION

The conventional solid state drive (SSD) uses mSATA standard, which has limited overall capacity because the number of flash memories that can be provided on the printed circuit board (PCB) is limited. Therefore, a more recent standard named Next Generation Form Factor (NGFF) or M.2 is developed for using with solid state drive. Since M.2 standard allows flash memory chips to be provided on both sides of the circuit board, it has advantages like smaller volume, higher capacity, and lower manufacturing cost, compared to the conventional mSATA standard.

General solid state drive with M.2 standard has various length specifications available for choosing, and the motherboard for a computer may also be designed to allow for solid state drive of different length specifications. In response to the need of fixing solid state drives of different length specifications in place, in most cases, the solid state drives with M.2 standard are fastened to the computer motherboard by screws and bolts. However, the use of screws and bolts as fastening means will cause a lot of inconveniences in assembling and disassembling the solid state drives to and from the motherboard. Further, bolts must be embedded in the computer motherboard for the screws to fasten thereto. This would inevitably result in increased manufacturing cost. Therefore, it is an important issue for relevant manufacturers to workout a way of upgrading the efficiency in assembling the M.2 solid state drive to the motherboard while reducing the overall manufacturing cost.

Taiwan Patent Pub. No. I568334 discloses an assembling fastener structure, which includes a loading section, a pivotally connecting section, a protruding section, and a retaining and pressing section. The loading section includes a loading surface and a back surface opposing to the loading surface. The pivotally connecting section and the protruding section are projected from the back surface and the loading surface of the loading section, respectively, to extend along an axial direction of the pivotally connecting section. The retaining and pressing section is radially protruded from one side of the protruding section to extend along a radial direction of the pivotally connecting section, so that the retaining and pressing section and the loading section together form a retaining groove between them, and a release opening not covered by the retaining and pressing section is formed at a diametrically opposite side of the retaining groove.

In the above assembling fastener structure, the pivotally connecting section can be easily snapped into an assembling hole on a circuit board. Further, with the retaining and pressing section that circumferentially encloses almost one half of the protruding section, an operator is able to mount and dismount an expansion component simply by turning the assembling fastener structure less than one circle in case of requiring a solid state drive of different length specification and to upgrade the efficiency in assembling components on the motherboard. In addition, since the above assembling fastener structure is snapped onto the circuit board, no screw and matching bolt are needed to be embedded in the mounting hole on the circuit board to thereby further reduce the material cost of the motherboard.

However, to use the above assembling fastener structure, a tool such as a slotted screwdriver is needed to extend into an operating slot pre-formed on the protruding section to turn the protruding section of the assembling fastener structure until one of the opposing retaining groove and release opening is oriented to the solid state drive, so as to set the assembling fastener structure to a locking or a releasing state. Since the above assembling fastener structure must be operated with a specific tool, i.e. the slotted screwdriver, it is not so convenient for use.

Taiwan Patent Pub. No. I693332 discloses a latch, which includes a base, a push button, and an elastic element. The base has a case, a primary fixing section, a secondary fixing section, and an unlocking handle. The case defines an internal receiving space and has a window provided on each of two sides. The primary and the secondary fixing section are protruded from one side of the case; and the primary fixing section has two wing sections diametrically symmetrically extended outward from an outer surface thereof; and the unlocking handle is connected to the secondary fixing section. The push button is pivotally connected to the base and includes a pressing section for operating the unlocking handle and a locking section for locking an object thereto. The elastic element is disposed between the push button and the base. The push button is rotatable between a locking position and an unlocking position relative to the base, and is biased toward the locking position by the elastic element.

To use the above latch, first extend the primary fixing section of the base through a primary locating hole on a mounting surface and then rotate the base for the two wing sections of the primary fixing section to rotate and upward abut against two lateral sides of the primary fixing hole and be held thereto. Meanwhile, the secondary fixing section is brought to set in a secondary locating hole formed on the mounting surface near one side of the primary locating hole, such that the base is securely fixed to the mounting surface. When it is desired to remove the base from the mounting surface, an operator may pull the unlocking handle, such that the unlocking handle brings the secondary fixing section to release from the secondary locating hole and the base can be rotated in a reverse direction to its initial position. At this point, the two wing sections of the primary fixing section can be moved upward to separate from the primary fixing hole and the base can be removed from the mounting surface.

However, the above latch has the following disadvantages in practical application thereof:

(1) The base must be rotated when being fixed to or removed from the mounting surface, so that the two wing sections are abutted against or released from two lateral sides of the primary locating hole, respectively, to allow subsequent operations. For this purpose, it is necessary to reserve sufficient space on the mounting surface to allow for the rotation of the base. The provision of the wing sections forms a waste of space, which does not satisfy the requirement for compactness in the modern trends of electronic products.

(2) The rotation of the primary fixing section would cause rubbing between the wing sections and the mounting surface, such as a circuit board surface, and frequent rubbing would cause wearing of the circuit board surface.

(3) The latch needs an elastic element disposed between the push button and the base and accordingly, must include a locating mechanism designed according to the elastic element. Therefore, the latch includes various components, which result in complicated structure and time-consuming assembly of the latch, rendering the latch non-economical for use.

In view of the above disadvantages in the prior art fastening or latch structures in application, it is tried by the inventor to develop an improved retaining mechanism to overcome the above disadvantages.

SUMMARY OF THE INVENTION

A primary object of the present invention is to provide a retaining mechanism, which can be repeatedly, quickly and removably connected to a substrate, and includes a seat and a sliding clamp member. The seat defines an open topped receiving space, a rear end of which is an inner stop surface and two sidewalls of which are provided with a horizontal guide section each. The sliding clamp member is received in the receiving space, and includes at least one mating guide section slidably engaged with and guided by the guide section to move relative to the seat and a curved elastic section having a free end pressing against the inner stop surface. The sliding clamp member further includes a beveled guide surface located opposite to the inner stop surface. The sliding clamp member is movable backward toward the inner stop surface to compress and deform the curved elastic section when the beveled guide surface is pressed downward by an edge of an electronic card, such that the sliding clamp member stores an elastic force for moving away from the inner stop surface, enabling the sliding clamp member to automatically spring forward to retain the electronic card in place when the electronic card passes over the beveled guide surface. The electronic card can be released simply by pushing the sliding clamp member backward. With the above arrangements, the retaining mechanism of the present invention is simple in structure and low in cost, and can be quickly and easily operated.

Another object of the present invention is to provide the above retaining mechanism, of which the sliding clamp member includes a pressing section located below the beveled guide surface. The pressing section has a curved end surface corresponding to a curved notch formed on the edge of the electronic card pressed against the sliding clamp member. When the electronic card moves downward along the beveled guide surface to the pressing section, the notch is engaged with the curved end surface of the pressing section, so that the electronic card is guided to move stably without shaking.

A further object of the present invention is to provide the above retaining mechanism, of which the seat is provided with a primary locating section corresponding to an elongated hollow-out primary engaging section on the substrate. The primary locating section includes a downward extended column-like support portion and an elongated flexible coupling portion horizontally connected to a distal end of the support portion. The coupling portion is provided at a front end thereof with a retaining protrusion. The front end of the coupling portion containing the retaining protrusion is slantly extendable through the primary engaging section to a location below a first end of the primary engaging section, and a rear end of the coupling portion can also be extended through the primary engaging section, such that the whole coupling portion can be moved horizontally below the substrate from the first end of the primary engaging section in a direction opposite to the retaining protrusion until the rear end of the coupling portion is abutted against a lower side of the substrate adjacent to a second end of the primary engaging section and the retaining protrusion is snapped into the first end of the primary engaging section. At this point, the seat is held in place and conveniently connected to the substrate without the need of using any tool.

The structure and the technical means adopted by the present invention to achieve the above and other objects can be best understood by referring to the following detailed description of the preferred embodiment and the accompanying drawings; wherein

DETAILED DESCRIPTION OF THE PREFERRED EMBODIMENTS

Figure 1:
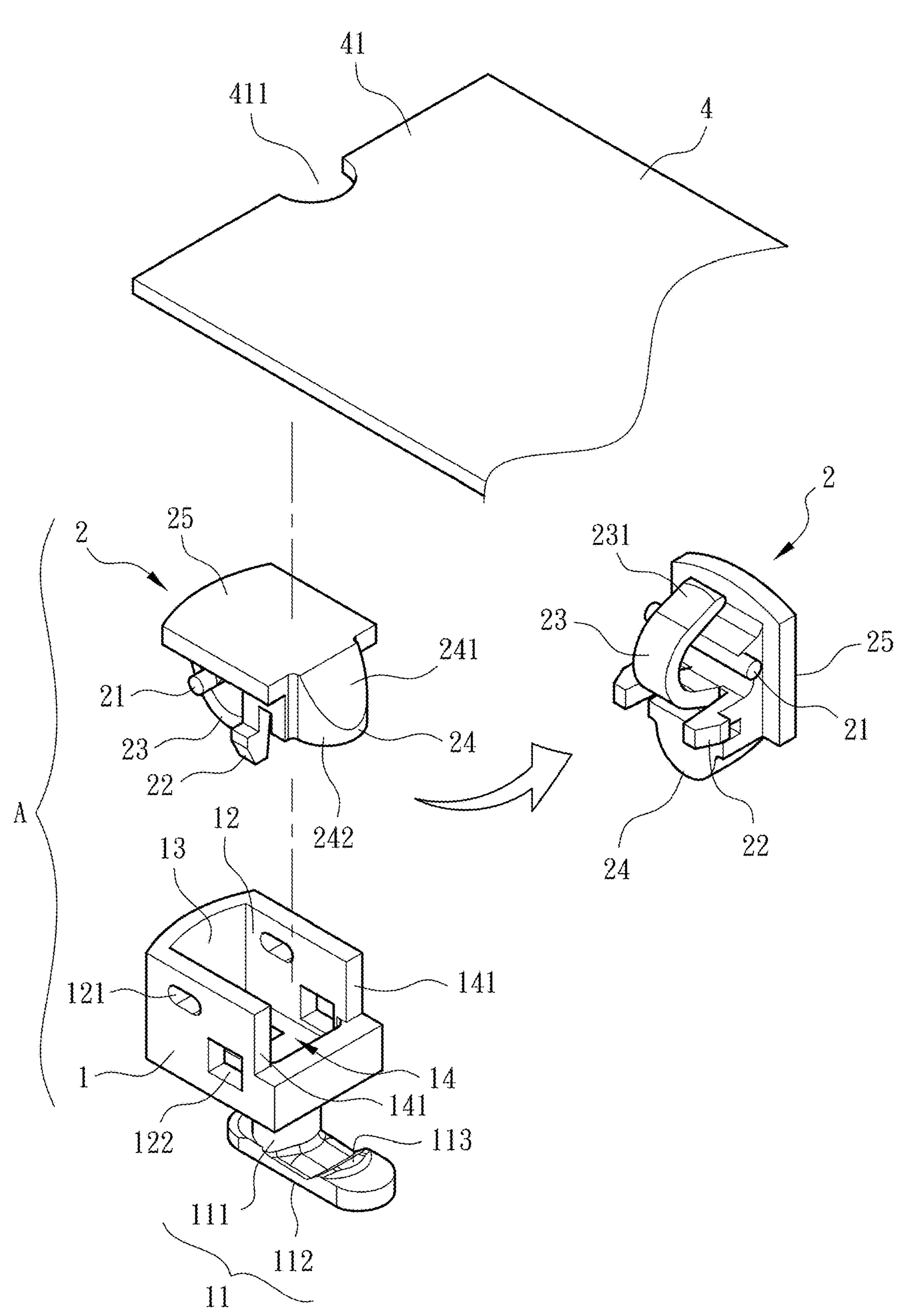
FIG. 1 is an exploded perspective view of a retaining mechanism according to a preferred embodiment of the present invention.
Figure 2:
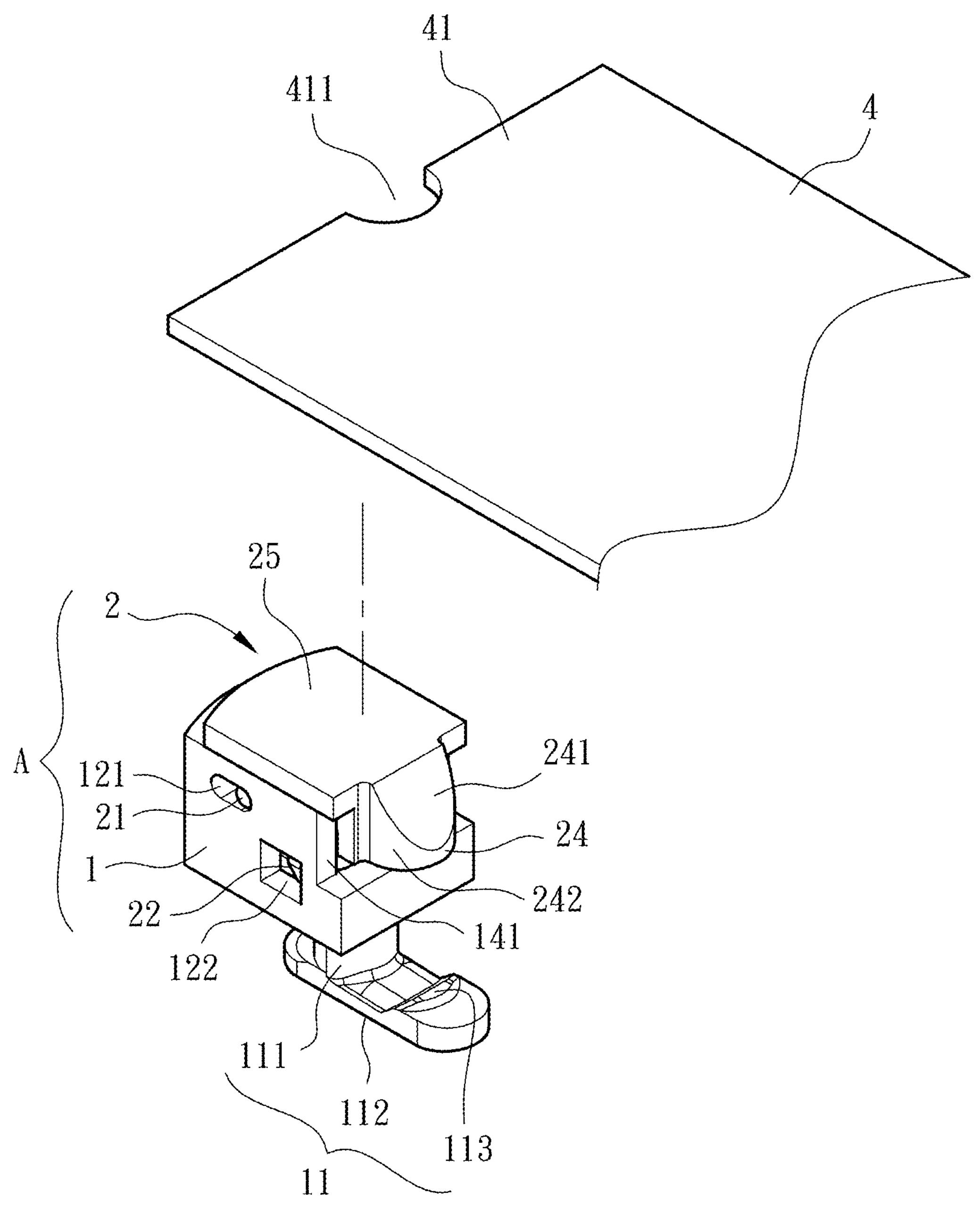
FIG. 2 is an assembled view of FIG. 1.
Figures 3, 4:
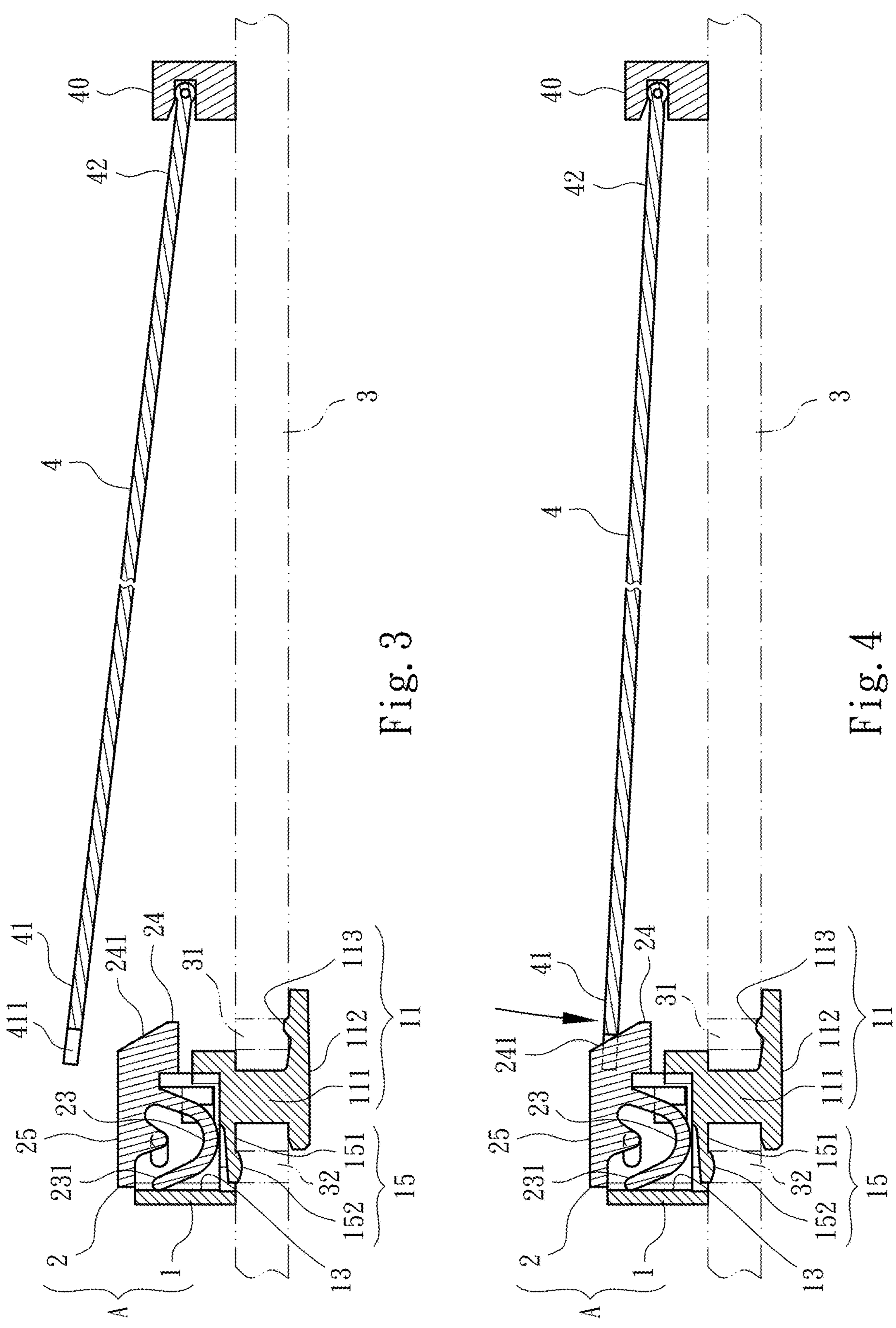
FIG. 3 is a sectional side view showing the retaining mechanism of the present invention is connected to a substrate and ready for retaining an electronic card in place.
FIG. 4 is a sectional side view showing the electronic card is pressed downward to contact with the retaining mechanism of the present invention.

Please refer to FIGS. 1, 2, and 3. The present invention is a retaining mechanism A including a seat 1 for connected to a substrate 3 and a sliding clamp member 2 slidably connected to the seat 1. The seat 1 has a recessed open top formed into a receiving space 12. The receiving space 12 has a rear end being an inner stop surface 13, and a front end being an end opening 14. Two lateral walls of the receiving space 12 located adjacent to the end opening 14 provide two stop surfaces 141. At least one or two of the two stop surfaces 141 are respectively provided with a guide section 121 and a limiting section 122 that are extended parallelly. In the illustrated preferred embodiment, both the two stop surfaces 141 are provided with one guide section 121 and one limiting section 122. In an operable embodiment, the guide sections 121 and the limiting sections 122 are hollow-out guiding slots.

The sliding clamp member 2 is partially received in the receiving space 12. The sliding clamp member 12 includes a push section 25 exposed from a top of the receiving space 12, and two lateral walls extended into the receiving space and each provided with a mating guide section 21 and a mating limiting section 22 corresponding to and slidably engaged with the guide section 121 and the limiting section 122, respectively. In an operable embodiment, the mating guide section 21 is in the form of a sidewardly projected shaft extending into the guide section 121, and the mating limiting section 22 is a hook-shaped structure extending into and hooking to the limiting section 122.

The sliding clamp member 2 further includes a curved elastic section 23 having a free end 231 extending rearward and elastically pressed against the inner stop surface 13. The sliding clamp member 2 is provided at a front end opposite to the inner stop surface 13 with a pressing section 24, which is protruded beyond the end opening 14 of the seat 1. The pressing section 24 has an upper front portion formed into a downward slanted beveled guide surface 241.

In an operable embodiment, the seat 1 includes a primary locating section 11 downward extended from a bottom thereof to correspondingly engage with a primary engaging section 31 formed on the substrate 3 and accordingly, be held in place on the substrate 3. In the illustrated preferred embodiment, the primary locating section 11 includes a column-like support portion 111 and an elongated flexible coupling portion 112 horizontally connected to an end of the support portion 111 farther away from the seat 1. The coupling portion 112 is provided at a front end thereof with a retaining protrusion 113. The primary engaging section 31 on the substrate 3 is in the form of an elongated hollow-out slot, which has a length smaller than that of the coupling portion 112.

To connect the retaining mechanism A to the substrate 3, the front end of the coupling portion 112 of the seat 1 having the retaining protrusion 113 provided thereat is slantly extended through the elongated hollow-out slot of the primary engaging section 31 to a location below a first end of the primary engaging section 31. Then, a rear end of the coupling portion 112 is also extended through the elongated hollow-out slot of the primary engaging section 31, such that the whole coupling portion 112 is horizontally movable below the substrate 3 from the first end of primary engaging section 31 in a direction opposed to the retaining protrusion 113 until the rear end of the coupling portion 112 is abutted against a bottom of the substrate 3 adjacent to a second end of the primary engaging section 31. Meanwhile, the retaining protrusion 113 is also moved into the first end of the elongated hollow-out slot of the primary engaging section 31, enabling the seat 1 to be securely connected to the substrate 3.

In the above structure, the seat 1 may further includes a secondary locating section 15 provided on the bottom thereof, if necessary; and the substrate 3 may be correspondingly provided with a secondary engaging section 32. In the illustrated preferred embodiment, the secondary engaging section 32 is in the form of an engaging bore; and the secondary locating section 15 includes a spring plate 151, which has a locating protrusion 152 provided on a free end thereof to face toward the coupling portion 112. When the seat 1 is connected to the substrate 3, the locating protrusion 152 is also snapped into the engaging bore of the secondary engaging section 32 to form a locating mechanism that assists the primary locating section 11.

Please refer to FIGS. 3 to 7, which show the practical application of the retaining mechanism A of the present invention to retain an electronic card 4 (such as a solid state drive) in place on the substrate 3. First, plug an electrical connecting end 42 of the electronic card 4 into a terminal socket 40 provided on the substrate 3, and then press another engaging end 41 of the electronic card 4 downward, as shown in FIG. 3, such that the engaging end 41 of the electronic card 4 is in contact with and pushes against the beveled guide surface 241 of the sliding clamp member 2, as shown in FIG. 4.

Figures 5, 6:
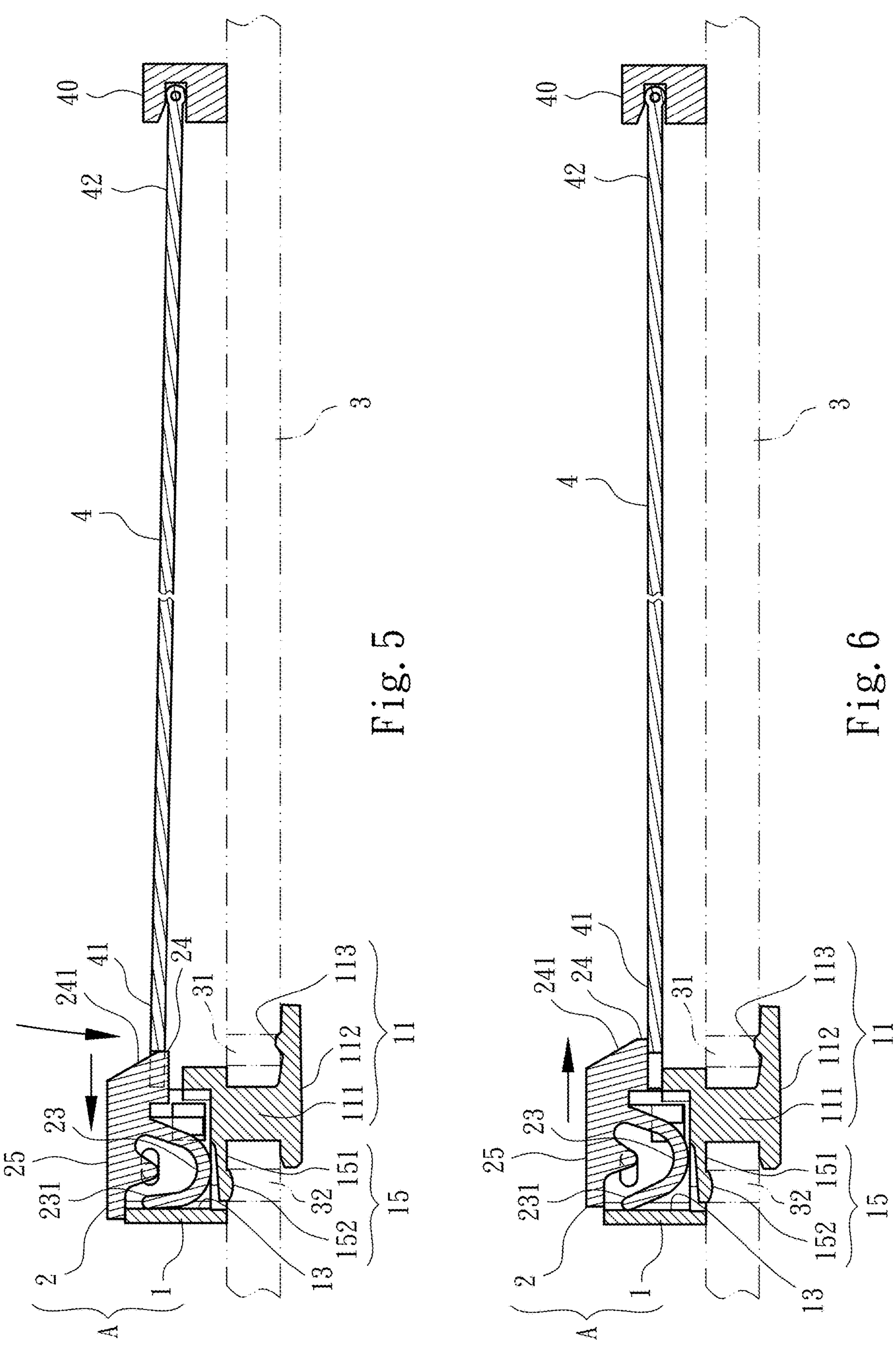
FIG. 5 is a sectional side view showing the downward pressed electronic card pushes against a front end of a sliding clamp member of the retaining mechanism and accordingly, compresses a curved elastic section at a rear end of the sliding clamp member.
FIG. 6 is a sectional side view showing the electronic card is fully pressed downward and held in place by the retaining mechanism of the present invention.

In the course of pressing the engaging end 41 of the electronic card 4 downward, the engaging end 41 keeps pushing against the beveled guide surface 241 to finally pass over the pressing section 24 while pushing the sliding clamp member 2 to slide toward the inner stop surface 13. At this point, the curved elastic section 23 is compressed and deformed elastically, as shown in FIG. 5. In an operable embodiment, the engaging end 41 of the electronic card 4 is provided with a notch 411 having a curved edge; and the pressing section 24 has a corresponding curved end surface 242. When the engaging end 41 of the electronic card 4 slides downward along the beveled guide surface 241 to pass over the pressing section 24, the notch 411 fitly engages with the curved end surface 242, enabling the electronic card 4 to pass over the pressing section 24 stably without shaking.

When the electronic card 4 is pressed downward to a location below the pressing section 24, a front edge of the electronic card 4 is in contact with the stop surfaces 141 on the seat 1, and the curved elastic section 23 elastically compressed by the sliding clamp member 2 releases an elastic restoring force thereof to spring to its initial position, enabling the pressing section 24 to abut on a top of the engaging end 41, or the edge of the notch 411, so that the electronic card 4 is held in place and available for use, as shown in FIG. 6.

Figure 7:
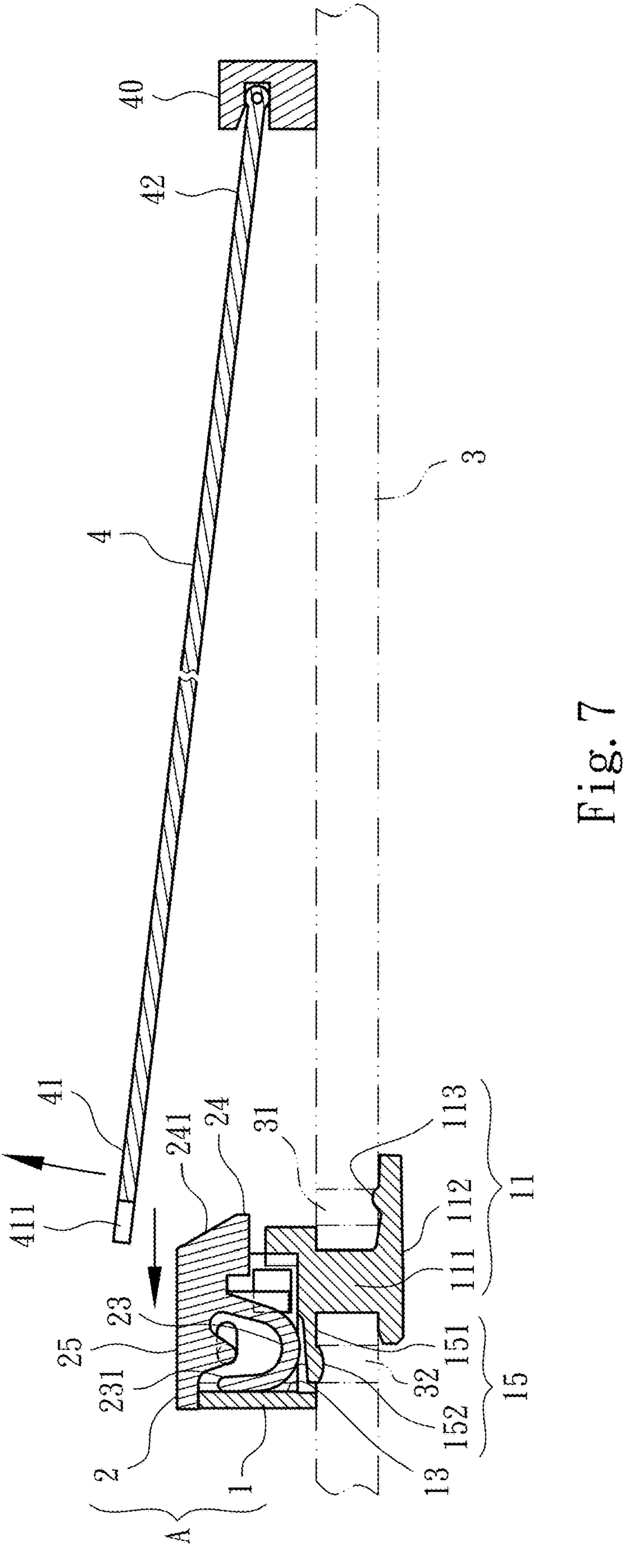
FIG. 7 is a sectional side view showing the electronic card is released from the retaining mechanism and elastically tips up to an initial position before being pressed downward.

On the other hand, when it is desired to release the electronic card 4 from the retaining mechanism A, simply apply an external force on the push section 25 for the sliding clamp member 2 to slide rearward toward the inner stop surface 13 (in a direction away from the electronic card 4), so that the curved elastic section 23 is compressed and deformed elastically. At this point, the pressing section 24 is separated from the engaging end 41 or the edge of the notch 411 and releases the electronic card 4, and the engaging end 41 is tipped up synchronously under an elastic force applied to the electrical connecting end 42 of the electronic card 4 by the terminal socket 40 and moves to a position that allows an operator to unplug the electronic card 4 easily, as shown in FIG. 7. When the force applied to the push section 25 is removed, the curved elastic section 23 of the sliding clamp member 2 automatically springs back to its initial position.

In conclusion, the retaining mechanism according to the present invention indeed has the advantages of simplified structure, easy to mount and dismount, convenient to operate, and space-saving to meet the requirements of novelty and improvement for granting a patent. It is also understood the present invention has been described with a preferred embodiment thereof and many changes and modifications in the described embodiment can be carried out without departing from the scope and the spirit of the invention that is intended to be limited only by the appended claims.

What is claimed is:

1. A repeatedly, quickly and removably connectable retaining mechanism, comprising:

a seat having a recessed open top formed into a receiving space; and the receiving space having a rear end being an inner stop surface and including a guide section provided on at least one sidewall thereof; and a sliding clamp member being partially received in the receiving space on the seat; the sliding clamp member including at least a mating guide section slidably engaged with and guided by the guide section to move relative to the seat and a curved elastic section having a free end elastically pressed against the inner stop surface; the sliding clamp member further including a pressing section located opposite to the inner stop surface and a beveled guide surface formed on an upper front portion of the pressing section; the sliding clamp member being movable toward the inner stop surface to compress and deform the curved elastic section when the beveled guide surface is pressed downward by an edge of an electronic card, and the elastically deformed curved elastic section enabling the sliding clamp member to store an elastic force for moving away from the inner stop surface; and the sliding clamp member automatically springing away from the inner stop surface and the pressing section thereof retaining the electronic card in place when the electronic card is fully pressed downward to pass over the pressing section.

2. The retaining mechanism as claimed in claim 1, wherein the receiving space has a front end being an end opening located opposed to the inner stop surface, and two lateral walls located adjacent to the end opening to provide a stop surface each; and the pressing section of the sliding clamp member being protruded beyond the end opening of the seat.

3. The retaining mechanism as claimed in claim 2, wherein the electronic card is provided on an end closer to the sliding clamp member with a notch having a curved edge, and the pressing section having a curved end surface corresponding to the notch, such that the notch fitly engages with the curved end surface when the end of the electronic card containing the notch slides downward along the beveled guide surface, enabling the electronic card to pass over the pressing section stably without shaking.

4. The retaining mechanism as claimed in claim 2, wherein the sliding clamp member includes a push section exposed from the receiving space.

5. The retaining mechanism as claimed in claim 4, wherein the receiving space is provided on sidewalls thereof with at least one limiting section extending in parallel to the guide section, and the sliding clamp member being provided with at least one mating limiting section corresponding to the limiting section; and the mating limiting section being engaged with and guided by the limiting section to slide.

6. The retaining mechanism as claimed in claim 2, wherein the receiving space is provided on sidewalls thereof with at least one limiting section extending in parallel to the guide section, and the sliding clamp member being provided with at least one mating limiting section corresponding to the limiting section; and the mating limiting section being engaged with and guided by the limiting section to slide.

7. The retaining mechanism as claimed in claim 6, wherein the at least one guide section and the at least one limiting section are respectively a hollow-out guide slot; the mating guide section being a projected shaft extending into the guide section; and the mating limiting section being a hook-shaped structure extending into and hooking to the limiting section.

8. The retaining mechanism as claimed in claim 6, wherein the seat is connected to a substrate and includes a primary locating section, which has a downward extended column-like support portion and an elongated flexible coupling portion horizontally located at a distal end of the support portion; the coupling portion being provided at a front end thereof with a retaining protrusion, and the substrate being provided with a primary engaging section in the form of an elongated hollow-out slot; the front end of the coupling portion of the seat containing the retaining protrusion being slantly extendable through the primary engaging section to a location below a first end of the primary engaging section, and a rear end of the coupling portion also being extended through the primary engaging section, such that the whole coupling portion can be moved horizontally below the substrate from the first end of the primary engaging section in a direction opposite to the retaining protrusion until the rear end of the coupling portion is abutted against a lower side of the substrate located adjacent to a second end of the primary engaging section and the retaining protrusion is snapped into the first end of the primary engaging section.

9. The retaining mechanism as claimed in claim 2, wherein the seat is connected to a substrate and includes a primary locating section, which has a downward extended column-like support portion and an elongated flexible coupling portion horizontally located at a distal end of the support portion; the coupling portion being provided at a front end thereof with a retaining protrusion, and the substrate being provided with a primary engaging section in the form of an elongated hollow-out slot; the front end of the coupling portion of the seat containing the retaining protrusion being slantly extendable through the primary engaging section to a location below a first end of the primary engaging section, and a rear end of the coupling portion also being extended through the primary engaging section, such that the whole coupling portion can be moved horizontally below the substrate from the first end of the primary engaging section in a direction opposed to the retaining protrusion until the rear end of the coupling portion is abutted against a lower side of the substrate located adjacent to a second end of the primary engaging section and the retaining protrusion is snapped into the first end of the primary engaging section.

10. The retaining mechanism as claimed in claim 1, wherein the sliding clamp member includes a push section exposed from the receiving space.

11. The retaining mechanism as claimed in claim 10, wherein the receiving space is provided on sidewalls thereof with at least one limiting section extending in parallel to the guide section, and the sliding clamp member being provided with at least one mating limiting section corresponding to the limiting section; and the mating limiting section being engaged with and guided by the limiting section to slide.

12. The retaining mechanism as claimed in claim 11, wherein the at least one guide section and the at least one limiting section are respectively a hollow-out guide slot; the mating guide section being a projected shaft extending into the guide section; and the mating limiting section being a hook-shaped structure extending into and hooking to the limiting section.

13. The retaining mechanism as claimed in claim 1, wherein the receiving space is provided on sidewalls thereof with at least one limiting section extending in parallel to the guide section, and the sliding clamp member being provided with at least one mating limiting section corresponding to the limiting section; and the mating limiting section being engaged with and guided by the limiting section to slide.

14. The retaining mechanism as claimed in claim 13, wherein the at least one guide section and the at least one limiting section are respectively a hollow-out guide slot; the mating guide section being a projected shaft extending into the guide section; and the mating limiting section being a hook-shaped structure extending into and hooking to the limiting section.

15. The retaining mechanism as claimed in claim 14, wherein the seat is connected to a substrate and includes a primary locating section, which has a downward extended column-like support portion and an elongated flexible coupling portion horizontally located at a distal end of the support portion; the coupling portion being provided at a front end thereof with a retaining protrusion, and the substrate being provided with a primary engaging section in the form of an elongated hollow-out slot; the front end of the coupling portion of the seat containing the retaining protrusion being slantly extendable through the primary engaging section to a location below a first end of the primary engaging section, and a rear end of the coupling portion also being extended through the primary engaging section, such that the whole coupling portion can be moved horizontally below the substrate from the first end of the primary engaging section in a direction opposed to the retaining protrusion until the rear end of the coupling portion is abutted against a lower side of the substrate located adjacent to a second end of the primary engaging section and the retaining protrusion is snapped into the first end of the primary engaging section.

16. The retaining mechanism as claimed in claim 15, wherein the substrate is provided at a location adjacent to the primary engaging section with a secondary engaging section, which is in the form of an engaging bore, and the seat is provided on a bottom with a secondary locating section having a spring plate; the spring plate having a locating protrusion provided on a free end thereof to face toward the coupling portion, and the locating protrusion being snapped into the secondary engaging section when the seat is held in place on the substrate.

17. The retaining mechanism as claimed in claim 13, wherein the seat is connected to a substrate and includes a primary locating section, which has a downward extended column-like support portion and an elongated flexible coupling portion horizontally located at a distal end of the support portion; the coupling portion being provided at a front end thereof with a retaining protrusion, and the substrate being provided with a primary engaging section in the form of an elongated hollow-out slot; the front end of the coupling portion of the seat containing the retaining protrusion being slantly extendable through the primary engaging section to a location below a first end of the primary engaging section, and a rear end of the coupling portion also being extended through the primary engaging section, such that the whole coupling portion can be moved horizontally below the substrate from the first end of the primary engaging section in a direction opposite to the retaining protrusion until the rear end of the coupling portion is abutted against a lower side of the substrate located adjacent to a second end of the primary engaging section and the retaining protrusion is snapped into the first end of the primary engaging section.

18. The retaining mechanism as claimed in claim 17, wherein the substrate is provided at a location adjacent to the primary engaging section with a secondary engaging section, which is in the form of an engaging bore, and the seat is provided on a bottom with a secondary locating section having a spring plate; the spring plate having a locating protrusion provided on a free end thereof to face toward the coupling portion, and the locating protrusion being snapped into the secondary engaging section when the seat is held in place on the substrate.

19. The retaining mechanism as claimed in claim 1, wherein the seat is connected to a substrate and includes a primary locating section, which has a downward extended column-like support portion and an elongated flexible coupling portion horizontally located at a distal end of the support portion; the coupling portion being provided at a front end thereof with a retaining protrusion, and the substrate being provided with a primary engaging section in the form of an elongated hollow-out slot; the front end of the coupling portion of the seat containing the retaining protrusion being slantly extendable through the primary engaging section to a location below a first end of the primary engaging section, and a rear end of the coupling portion also being extended through the primary engaging section, such that the whole coupling portion can be moved horizontally below the substrate from the first end of the primary engaging section in a direction opposed to the retaining protrusion until the rear end of the coupling portion is abutted against a lower side of the substrate located adjacent to a second end of the primary engaging section and the retaining protrusion is snapped into the first end of the primary engaging section.

20. The retaining mechanism as claimed in claim 19, wherein the substrate is provided at a location adjacent to the primary engaging section with a secondary engaging section, which is in the form of an engaging bore, and the seat is provided on a bottom with a secondary locating section having a spring plate; the spring plate having a locating protrusion provided on a free end thereof to face toward the coupling portion, and the locating protrusion being snapped into the secondary engaging section when the seat is held in place on the substrate.

* * * * *